United States Patent [19]

Kotani et al.

[11] 4,242,691
[45] Dec. 30, 1980

[54] MOS SEMICONDUCTOR DEVICE

[75] Inventors: Norihiko Kotani; Satoru Kawazu, both of Itami, Japan

[73] Assignee: Mitsubishi Denki Kabushiki Kaisha, Tokyo, Japan

[21] Appl. No.: 943,812

[22] Filed: Sep. 18, 1978

[51] Int. Cl.³ .......................................... H01L 29/78
[52] U.S. Cl. ...................................... 357/23; 357/58; 357/89
[58] Field of Search ......................... 357/23, 58, 89

[56] References Cited

U.S. PATENT DOCUMENTS

| | | | |
|---|---|---|---|
| 3,696,276 | 10/1972 | Boland | 357/23 |
| 3,823,352 | 7/1974 | Pruniaux et al. | 357/58 |

*Primary Examiner*—Edward J. Wojciechowicz
*Attorney, Agent, or Firm*—Wenderoth, Lind & Ponack

[57] ABSTRACT

The disclosed MOS transistor includes a channel region formed of a lightly doped semiconductor layer disposed in a surface portion of a heavily doped semiconductor layer subsequently disposed on a lightly doped semiconductor substrate. The channel region may be of the identical or opposite conductivity type to the heavily doped semiconductor layer that has the same type conductivity as the substrate. Also the channel region may be of an intrinsic semiconductive material. A source and a drain region may be disposed in the lightly or highly doped layer. Alternatively the source and drain regions may reach the substrate.

9 Claims, 22 Drawing Figures

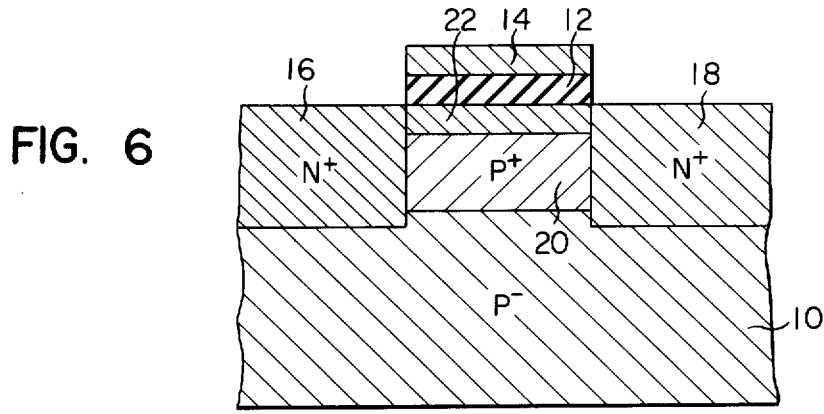
FIG. 6
FIG. 7a
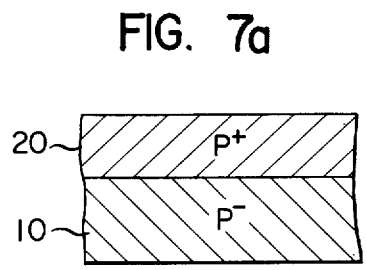
FIG. 7b
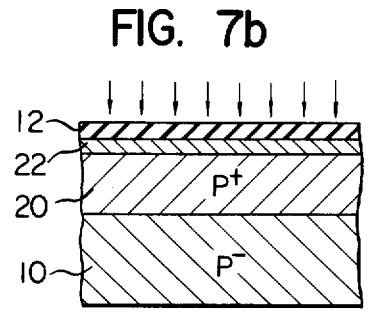
FIG. 7c
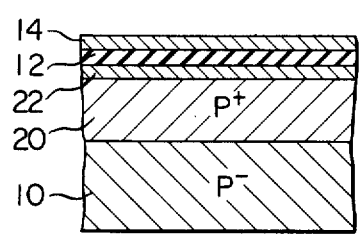
FIG. 7d
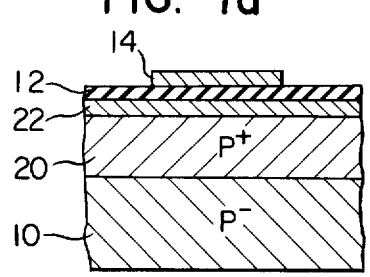
FIG. 7e
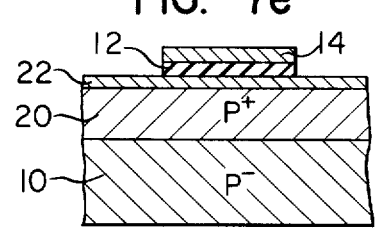
FIG. 7f
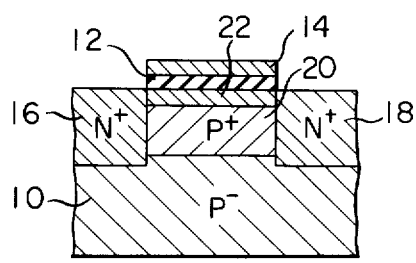

MOS SEMICONDUCTOR DEVICE

BACKGROUND OF THE INVENTION

This invention relates to improvements in an MOS transistor.

Conventional N channel MOS transistors have comprised an N+ type source region and the N+ type drain region disposed in spaced relationship on one of the opposite main faces of a P− type silicon substrate and a gate electrode formed of a polycrystalline silicon layer disposed on a silicon dioxide film subsequently disposed on the one main face of the substrate between the source and drain regions. When the distance between those source and drain regions, i.e. the channel length becomes short, the application of a voltage across the two regions has resulted in the punch-through of the transistors which does not greatly affect the potential on the polycrystalline silicon layer.

In order to avoid the punch-through, it has been already proposed to increase the impurity concentration of the silicon substrate or to decrease the depth of the source and drain regions. The former method has brought about an increase in the rate of change in the threshold voltage or a body effect constant due to a back gate voltage applied across the source region and the silicon substrate. The latter method has resulted in the disadvantage that the breakdown voltage of the PN junction decreases because the PN junction has a small radius of curvature.

Therefore conventional N channel MOS transistors cannot be used to form integrated circuits having a high scale integration. This is also true in the case of conventional P channel MOS transistors.

Accordingly it is a general object of the present invention to improve MOS transistors.

It is an object of the present invention to provide a new and improved MOS transistor normally operative even though it has a short channel length yet which is not subject to punch-through.

It is another object of the present invention to provide a new and improved MOS transistor suitable for forming large scale integrated circuits.

It is still another object of the present invention to provide a new and improved MOS transistor which does not have an increased threshold voltage, an increased body effect constant or a decreased breakdown voltage of the PN junction.

It is a still further object of the present invention to provide a new and improved MOS transistor having a high drain breakdown voltage.

SUMMARY OF THE INVENTION

The present invention provides an MOS semiconductor device comprising a semiconductor substrate of a first type conductivity having a low impurity concentration and including a main face, a first semiconductor layer of the first type conductivity disposed on the main face of the semiconductor substrate and having a high impurity concentration, a second semiconductor layer disposed on the surface of the first semiconductor layer, the second semiconductor layer being formed of a selected semiconductor taken from the group consisting of a lightly doped semiconductive material and an intrinsic semiconductive material, a channel region defined by a predetermined portion of the second semiconductor layer, a pair of source and drain regions positioned for forming a channel region therebetween, each of the source and drain regions having a second type conductivity and a high impurity concentration, an oxide film on the channel region, and a gate electrode disposed on the oxide film.

BRIEF DESCRIPTION OF THE DRAWINGS

The present invention will become more readily apparent from the following detailed description taken in conjunction with the accompanying drawings in which:

FIG. 6 is a view similar to FIG. 2 but illustrating another modification of the present invention; and FIGS. 7a through 7f are views similar to FIGS. 3a through 3f respectively but illustrating the method of making the transistor shown in FIG. 6.

Throughout the Figures like reference numerals designate the identical or corresponding components.

DESCRIPTION OF THE PREFERRED EMBODIMENTS

Figure 1:
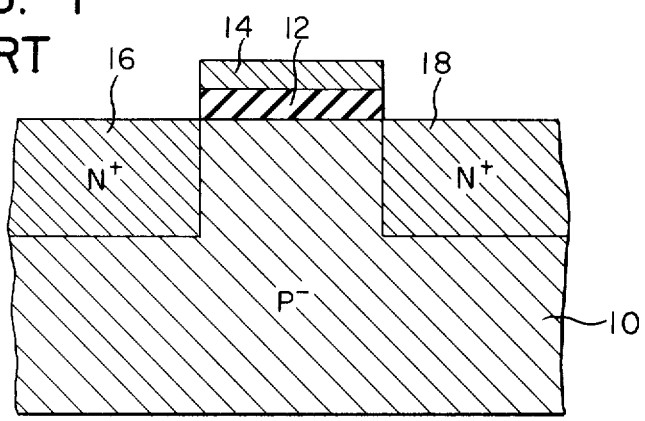
FIG. 1 is a fragmental cross sectional view of the essential part of an N channel MOS transistor constructed in accordance with the principles of the prior art.

Referring now to FIG. 1 of the drawings, there is illustrated an N channel MOS transistor having a conventional construction. The arrangement illustrated comprises a substrate 10 of semiconductive material lightly doped with a P type impurity, in this case, a P− type silicon substrate, a silicon dioxide ($SiO_2$) film 12 disposed on a predetermined portion of one of the opposite main faces of the substrate 10 and a gate electrode 14 formed of a polycrystalline silicon layer disposed on the silicon dioxide film 12. The silicon dioxide film 12 is an electrically insulating film formed by thermally oxidizing the predetermined portion of the one main face of the substrate 10 in a well known manner. Then an N type impurity is selectively diffused into the one main face of the substrate 10 with the silicon dioxide film 12 used as a mask. This results in the formation of an N+ type source 16 and an N+ drain region 18 respectively on the main face of the substrate 10 on both sides of the portion covered by the silicon dioxide film 12 as shown in FIG. 1, which thus becomes a channel.

When a distance between the source and drain regions 16 and 18, that is, the channel length is short, the application of a voltage across the source and drain regions causes a flow of current at low gate voltages between those regions and through the channel disposed therebetween. This flow of current is not affected very much by the potential on the polycrystalline silicon layer 14 and results in punch-through as a result of which the turning on and off of the transistor cannot be adequately controlled. In the arrangement of FIG. 1, therefore, the channel length can not be less than a predetermined magnitude. For example, if the source and drain regions 16 and 18 respectively are about 1 μm in depth and the silicon substrate 10 has an impurity concentration of $2 \times 10^{15}$ atoms/cm$^3$ then the channel length must be greater than 3 μm.

Accordingly, semiconductor integrated circuits having large scale integrations can not be produced by using MOS transistors having a structure such as shown in FIG. 1.

In order to throw light on the punch-through phenomenon, a two-dimensional analysis has been conducted with MOS transistors such as shown in FIG. 1 by solving a system of a Poisson's equation and an equation for continuity of current with respect to a two-dimensional orthogonal coordinate system including both axes represented by the length and depth of the channel in MOS transistors. The results of the analysis have indicated that even with a null voltage applied across the source and drain regions, a depletion layer extending from the source region 16 is connected to that extending from the drain region 18 at a depth of from about 0.3 to about 0.5 μm measured from the interface between the silicon dioxide film 12 and the one main face of the substrate 10 toward the other main face thereof. Because of this a high carrier concentration layer couples the source region 16 to the drain region 18 and always has a current flowing therethrough because it has a carrier concentration which is not affected very much by a potential on the polycrystalline silicon layer 14. This has resulted in the occurrence of punch-through as above described.

In order to prevent the occurrence of punch-through, the practice generally adopted has been to increase the impurity concentration of the silicon substrate or to decrease the depth of the source and drain regions. An increase in impurity concentration has brought about an increase in threshold voltage and also an increase in the rate of change of the threshold voltage or body effect constant due to a voltage applied across the source region 16 and the silicon substrate 10. That voltage is called a back gate voltage. This has resulted in a drawback that the high scale integration configuration is adversely affected. Alternatively, if the source and drain regions are made shallow then the associated PN junctions have a decreased radius of curvature leading to the disadvantage that the PN junctions have a lower breakdown voltage.

The present invention seeks to eliminate the objection to and the disadvantage of the prior art practice as above described.

Figure 2:
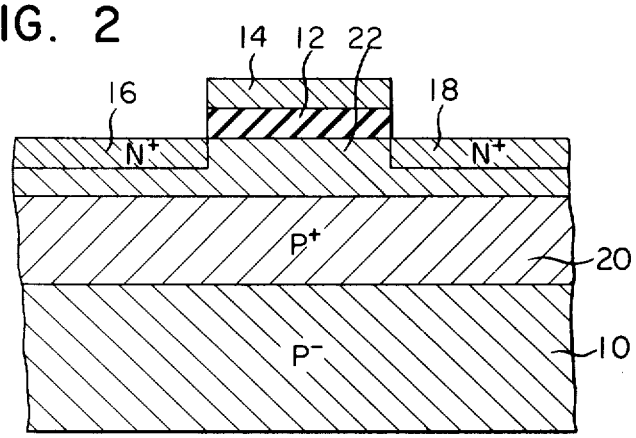
FIG. 2 is a fragmental cross sectional view of the essential part of an N channel MOS transistor constructed in accordance with the principles of the present invention.

Referring now to FIG. 2, there is illustrated an N channel MOS transistor constructed in accordance with the principles of the present invention. The arrangement illustrated is different from that shown in FIG. 1 only in that in FIG. 2 the P⁻ type silicon substrate 10 shown in FIG. 1 is replaced by a stack made up of a P⁻ type silicon substrate 10, a first semiconductor layer 20 disposed on the substrate 10 and a second semiconductor layer 22 disposed on the first semiconductor layer 20. The first semiconductor layer 20 is heavily doped with a P type impurity and therefore is a P⁺ type layer while the second semiconductor layer 22 is composed of a lightly doped semiconductor layer formed by implanting ions of an impurity having a small diffusing coefficient, for example arsenic or antimony, into the surface of the first semiconductor layer 20 through a silicon dioxide film from which the gate film 12 is formed to effect an impurity compensation. The second semiconductor layer 22 may be a P⁻ or an N⁻ type. Alternatively, the second semiconductor layer 22 may be a layer of an intrinsic semiconductor material disposed on the first semiconductor layer 20.

A process of manufacturing the arrangement of FIG. 2 will now be described in conjunction with FIGS. 3a through 3f.

Figure 3A:
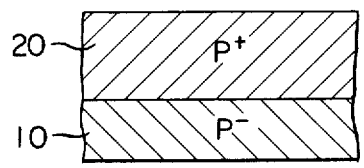
FIGS. 3a through 3f are fragmental cross sectional views illustrating the manufacturing steps of a process for producing an MOS transistor as shown in FIG. 2 in accordance with the principles of the present invention.

First a silicon substrate 10 lightly doped with a P type impurity is prepared and then the first P⁺ type semiconductor layer 20 is disposed on one of the opposite main faces, in this case the upper main face as viewed in FIG. 3a, of the silicon substrate 10 by an epitaxial growth or thermal diffusion technique. The first semiconductor layer 20 has a thickness of from 1 to 1.5 μm.

The resulting structure is shown in FIG. 3a.

Figure 3B:
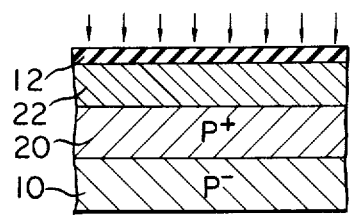

Subsequently, the surface of the first semiconductor layer 20 is thermally oxidized to form the silicon dioxide (SiO$_2$) film 12a with a thickness of from 200 to 1,000 Å thereon. Then an ion implantation technique is employed to implant ions of arsenic or antimony having an implantation energy of from 50 to 400 keV into the surface of the first semiconductor layer 20 through the silicon dioxide film 12a to provide a second semiconductor layer 22 on the first semiconductor layer 20 as shown in FIG. 3b.

Following this, a polycrystalline silicon layer 14a is disposed on the surface of the silicon dioxide film 12a by a vapor-phase growth technique.

Figure 3C:
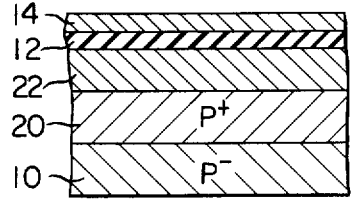

The resulting structure is illustrated in FIG. 3c.

Figure 3D:
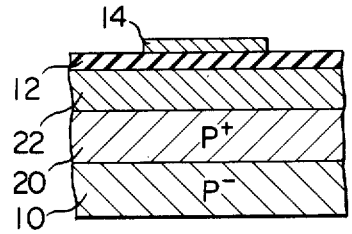

Thereafter photolithographic and etching techniques are utilized to remove selectively the polycrystalline silicon layer 14a to leave a pattern 14 of silicon with the shape of the desired channel on the silicon dioxide film 12a (see FIG. 3d).

Subsequently, the silicon dioxide film 12a is selectively etched away with the pattern 14 of the polycrystalline silicon used as a mask. This produces a silicon dioxide gate film 12 having the polycrystalline silicon pattern 14 therein positioned on the second semiconductor layer 22.

Figure 3E:
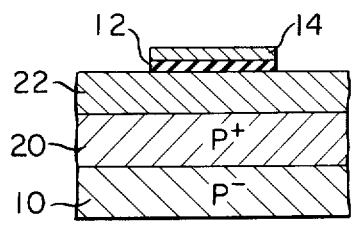

The resulting structure is shown in FIG. 3e.

Following this, the silicon dioxide gate film 12 is utilized as a mask and phosphorus is diffused into the exposed surface portions of the second semiconductor layer 22 at a temperature of about 950° C. to form respective source and drain regions 16 and 18 therein. That portion of the second semiconductor layer 22 disposed between regions 16 and 18 becomes a channel region. Each region 16 and 18 has an N⁺ type conductivity, a high impurity concentration and a depth ranging from 0.2 to 0.5 μm.

Figure 3F:
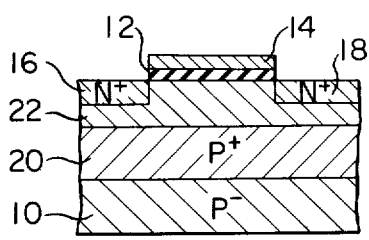

FIG. 3f shows the desired structure.

When forming the source and drain regions 16 and 18 respectively, it is to be noted that neither regions should be permitted to enter the first semiconductor layer 20. Also the second semiconductor layer 22 must have a thickness no greater than 0.5 μm after all heat treatments have been completed.

It is also possible to implant ions of a group III element such as boron (B) into the silicon substrate 10 to form a stack including a silicon substrate 10 that is a P⁻ type material, a first semiconductor layer 20 that is a P⁺ type material and a second semiconductor layer 22 that is a P⁻, N⁻ or I type material, said layers being superposed in intimate contact with one another. In such an arrangement, the impurity concentration of the first semiconductor layer or P⁺ type layer 20 can be controlled with respect to the depth thereof by effecting the ion implantation while controlling the acceleration energy of the ions. For example, if ions of boron with an acceleration or implantation energy of 400 keV are implanted into the semiconductor substrate 10 then the impurity concentration of the first semiconductor layer 20 can be controlled so as to have a depth of about 1 μm.

Further it is possible to form the source and drain regions 16 and 18 respectively by introducing any of the Group V elements other than phosphorus, for example arsenic or antimony, into the second semiconductor layer 22 by a thermal diffusion or ion implantation technique.

Referring back to FIG. 2, the operation of the N channel MOS transistor shown therein will now be described. A depletion layer extending from the source region 16 is not coupled to that extending from the drain region 18 within the first semiconductor layer 20 even when the channel length is as short as 0.5 μm. This is because the spread of the depletion layer is small within the first semiconductor layer 20. On the other hand, the depletion layer is apt to spread within the second semiconductor layer 22. But assuming that the second semiconductor layer 22 has a thickness on the order of 0.5 μm or less and that the source and drain regions 16 and 18 respectively have junction depths shallower or equal to the depth or thickness of the second semiconductor layer 22, the electric field due to the polycrystalline silicon layer 14 greatly affects the second semiconductor layer 22. If the polycrystalline silicon layer 14 has a potential ranging from 1 to 0.5 volt with respect to the source region 16 then the second semiconductor layer 22 as a whole forms an accumulation layer causing the transistor to be turned off.

Also, a threshold voltage can be fairly freely set because the number of ions of the impurity introduced into the first semiconductor layer 20 by the ion implantation technique can be readily controlled. Further, a back gate voltage can be applied across the silicon substrate 10 and the source region 16 to spread the depletion layers extending from the source and drain regions 16 and 18 respectively beyond the interface between the first semiconductor layer 20 and the silicon substrate 10. Under these circumstances, a change in back gate voltage causes the amount of the impurity included in each of the now spread portions of the depletion layers to be small in the silicon substrate 10. This decreases the body effect constant and is favorable for LSI or IC configurations.

Figure 4:
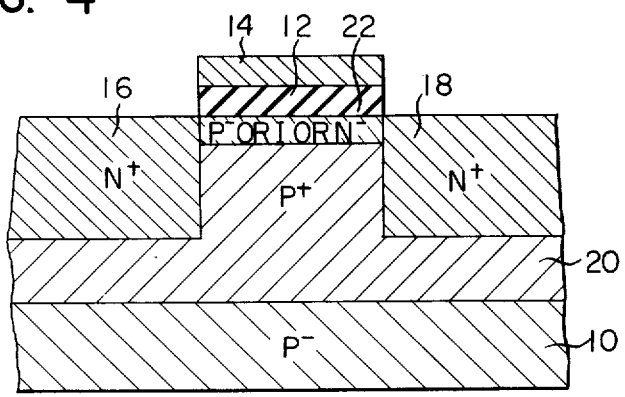
FIG. 4 is a view similar to FIG. 2 but illustrating a modification of the present invention.

The arrangement illustrated in FIG. 4 is different from that shown in FIG. 2 only in that in FIG. 4, the second semiconductor layer 22 is disposed only on the surface portion of the first semiconductor layer 20 between the source and drain regions 16 and 18 which are disposed in the first $P^+$ type semiconductor layer 20.

Figure 5A:
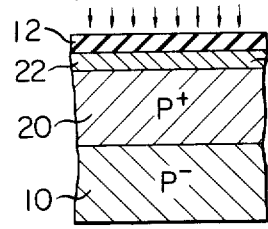
FIGS. 5a through 5f are views similar to FIGS. 3a through 3f respectively but illustrating the method of making the transistor shown in FIG. 4.

In order to produce the N channel MOS transistor shown in FIG. 4, the process as above described in conjunction with FIG. 3a is first repeated to form the structure illustrated in FIG. 5a and including the first semiconductor layer 20 having a thickness of from 1 to 2 μm.

Then, by repeating the process as above described in conjunction with FIG. 3b, the silicon dioxide film 12a is disposed on the surface of the first semiconductor layer 20 and the second semiconductor layer 22a is formed only on the surface portion of the first semiconductor 20. It is to be noted that the second semiconductor layer 22 has an $N^-$ type or $P^-$ type conductivity or is an intrinsic semiconductive material.

Figure 5B:
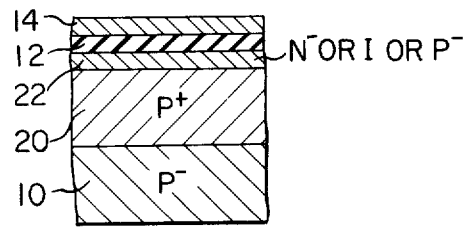

The resulting structure is shown in FIG. 5b.

Figure 5C:
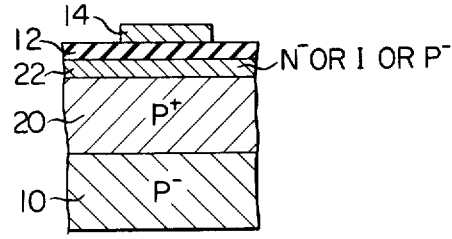

Subsequently, the polycrystalline silicon layer 14a is disposed on the silicon dioxide film 12 in the same manner as above described in conjunction with FIG. 3c (see FIG. 5c).

Figure 5D:
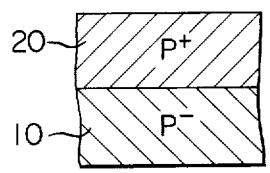

Then the polycrystalline silicon layer 14 is selectively etched away by repeating the process as above described in conjunction with FIG. 3d. This results in the structure shown in FIG. 5d.

Figure 5E:
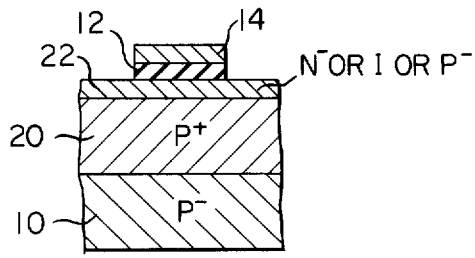

Thereafter the exposed portion of the silicon dioxide film 12 is etched away in the same manner as above described in conjunction with FIG. 3e resulting in the structure shown in FIG. 5e.

Figure 5F:
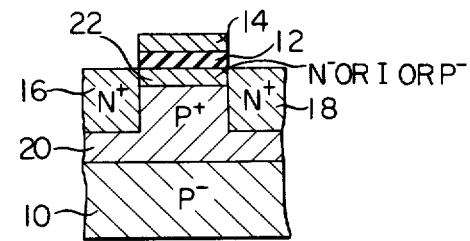

As above described in conjunction with FIG. 3f, phosphorus is selectively diffused into the structure shown in FIG. 5e to form a pair of $N^+$ type heavily doped source and drain regions 16 and 18 each having a thickness or depth of from 0.5 to 1.5 μm. That is, the source and drain regions 16 and 18 respectively extend into the first semiconductor layer 20 as shown in FIG. 5f.

It is to be noted that the second semiconductor layer 22 must be no more than about 0.5 μm thick after all the heat treatments have been completed.

As in the arrangement of FIG. 2, it is also possible to form a stack including the silicon substrate 10 that is a $P^-$ type material, a first semiconductor layer 20 that is a $P^+$ type material and a second semiconductor layer 20 that is an $N^-$, $P^-$ or I type material, superposed in intimate contact with one another by introducing ions of a group III element such as boron (B) into the silicon substrate 10 by an ion implantation technique. Also, by controlling the acceleration energy during the ion implantation, the impurity concentration of the first semiconductor layer 20 can be controlled with respect to the depth thereof.

The arrangement of FIG. 4 is identical in operation to that of the arrangement shown in FIG. 2 and has the same advantages concerning the threshold voltage and the body effect constant as the arrangement shown in FIG. 2.

The arrangement illustrated in FIG. 6 is different from that shown in FIG. 4 only in that in FIG. 6 the second semiconductor layer 22 has the first semiconductor layer 20 thereunder located only between the source and drain regions 16 and 18 respectively which regions extend somewhat into the $P^-$ type semiconductor substrate 10. The second semiconductor layer 22 may be either a semiconductive material lightly doped with an $N^-$ or a $P^-$ type impurity or an intrinsic semiconductive material.

FIGS. 7a through 7f show the successive manufacturing steps for producing the arrangement of FIG. 6 and illustrate substantially identical processes to those illustrated in FIGS. 5a through 5f respectively. It is, however, noted that in FIG. 7f the source and drain regions 16 and 18 respectively either reach or extend somewhat into the $P^-$ silicon substrate 10 and have a thickness or depth ranging from 0.5 to 1.5 μm. As in the arrangement of FIG. 4, the second semiconductor layer 22 as shown in FIG. 6 or 7f must have a thickness of no more than about 0.5 μm after all the heat treatments have been completed.

The arrangement illustrated is identical in operation to that shown in FIG. 4 and additionally advantageous in that because the $N^+$ diffusion regions 16 and 18 have an increased thickness, they have a large radius of curvature so as to increase the drain breakdown voltage.

While the present invention has been illustrated and described in conjunction with a few preferred embodiments thereof it is to be understood that numerous changes and modifications may be resorted to without departing from the spirit and scope of the present invention. For example, the present invention is equally applicable to P channel MOS transistors. In the latter case, an N⁻ type silicon substrate 10 is first prepared and an N+ type first semiconductor layer 20 is disposed on the silicon substrate 10. Then phosphorus is used to form the second semiconductor layer 22 after which the diffusion of a group III element results in the formation of P+ type source and drain regions 16 and 18 respectively. In addition, the present invention is equally applicable to semiconductor integrated circuits including MOS transistors.

What we claim is:

1. An MOS semiconductor device comprising a semiconductor substrate of a first type conductivity having a low impurity concentration and including a main face, a first semiconductor layer of the first type conductivity disposed on said main face of said semiconductor substrate and having a high impurity concentration, a second semiconductor layer of a predetermined type conductivity disposed on the surface of said first semiconductor layer, the material of said second semiconductor layer being a material from the group consisting of a lightly doped semiconductive material and an intrinsic semiconductive material, at least a portion of said second semiconductor layer constituting a channel region of said semiconductor device, a pair of source and drain regions disposed on opposite lateral sides of said channel region and sandwiching said channel region therebetween, each of said source and drain regions having a second type conductivity and a high impurity concentration, an oxide film on said channel region, and a gate electrode disposed on said oxide film, whereby even where the channel region is thin and the distance between the source and drain regions is short, punch-through can be prevented.

2. An MOS semiconductor device as claimed in claim 1 wherein said source and drain regions extend from the free surface of said channel region transversely of the thickness of said device into said first semiconductor layer and sandwich said second semiconductor layer therebetween.

3. An MOS semiconductor device as claimed in claim 2 wherein said second semiconductor layer has a thickness of no more than 3,000 Å.

4. An MOS semiconductor device as claimed in claim 1 wherein said source and drain regions extend from the free surface of said channel region transversely of the thickness of said device through said first and second semiconductor layers and into said semiconductor substrate.

5. An MOS semiconductor device as claimed in claim 1 wherein said second semiconductor layer is formed by introducing a second type conductivity imparting impurity into said first semiconductor layer through said oxide film by an ion implantation technique.

6. An MOS semiconductor device as claimed in claim 1 wherein said source and drain regions are diposed in the surface portion of said second semiconductor layer.

7. An MOS semiconductor device as claimed in claim 6 wherein said second semiconductor layer has a thickness of not greater than 0.5 µm.

8. An MOS semiconductor device as claimed in claim 4 wherein said second semiconductor layer has a thickness of not greater than 0.5 µm.

9. An MOS semiconductor device as claimed in claim 1 wherein said gate electrode comprises a polycrystalline semiconductor layer.

* * * * *